United States Patent
Yoon et al.

(10) Patent No.: US 8,139,427 B2
(45) Date of Patent: Mar. 20, 2012

(54) NONVOLATILE MEMORY DEVICE

(75) Inventors: Tae-Hun Yoon, Gyeonggi-do (KR);
Joo-Ae Lee, Gyeonggi-do (KR)

(73) Assignee: Hynix Semiconductor Inc.,
Gyeonggi-do (KR)

( * ) Notice: Subject to any disclaimer, the term of this patent is extended or adjusted under 35 U.S.C. 154(b) by 449 days.

(21) Appl. No.: 12/488,653

(22) Filed: Jun. 22, 2009

(65) Prior Publication Data

US 2010/0290274 A1    Nov. 18, 2010

(30) Foreign Application Priority Data

May 15, 2009    (KR) .................. 10-2009-0042612

(51) Int. Cl.
*G11C 7/00* (2006.01)
(52) U.S. Cl. .................. 365/189.15; 365/163; 365/148; 365/207
(58) Field of Classification Search ............. 365/189.15, 365/163, 148, 207
See application file for complete search history.

(56) References Cited

U.S. PATENT DOCUMENTS

| 7,283,387 B2 * | 10/2007 | Cho et al. ............. 365/163 |
| 7,397,681 B2 * | 7/2008 | Cho et al. ............. 365/46 |
| 7,643,344 B2 * | 1/2010 | Choi ............. 365/185.13 |
| 7,969,798 B2 * | 6/2011 | Hwang et al. ............. 365/189.09 |
| 2007/0103972 A1 * | 5/2007 | Ro et al. ............. 365/163 |

FOREIGN PATENT DOCUMENTS

KR    100688540    3/2007

OTHER PUBLICATIONS

Notice of Preliminary Rejection issued from Korean Intellectual Property Office on Nov. 30, 2010.

* cited by examiner

*Primary Examiner* — Tuan T Nguyen
*Assistant Examiner* — Toan Le
(74) *Attorney, Agent, or Firm* — IP & T Group LLP

(57) ABSTRACT

A nonvolatile memory device includes a data sense amplifier configured to supply a data detection current to a memory cell and detect a data detection voltage having a voltage level corresponding to a resistance of the memory cell, a first switching element configured to selectively transfer the data detection current to the memory cell, and a second switching element configured to be turned on simultaneously with the first switching element to selectively transfer the data detection current to the memory cell. The first switching element and the second switching element have a complementary voltage transfer characteristic.

17 Claims, 6 Drawing Sheets

NONVOLATILE MEMORY DEVICE

CROSS-REFERENCE TO RELATED APPLICATIONS

The present application claims priority under 35 U.S.C. §119(a) to a Korean Patent Application No. 10-2009-0042612, filed in the Korean Intellectual Property Office on May 15, 2009 which is incorporated herein by reference in its entirety.

BACKGROUND OF THE INVENTION

The present invention relates to a semiconductor design technology, and more particularly, to technology for detecting data stored in a nonvolatile memory cell.

Phase change random access memory (PCRAM) is a representative nonvolatile memory device that programs memory cells by using a programming current.

PCRAM having a nonvolatile memory characteristic can provide a random access, and can be highly integrated at low cost. PCRAM stores data by using a phase change material. To be specific, PCRAM is a nonvolatile memory device using a phase change of a phase change material depending on a temperature condition, that is, a resistance change depending on a phase change.

A phase change material is changeable to an amorphous state or a crystalline state according to a temperature condition. A representative phase change material is a chalcogenide alloy. Since a typical example of the phase change material is $Ge_2Sb_2Te_5$ containing germanium (Ge), antimony (Sb), and tellurium (Te), the phase change material is called a "GST".

PCRAM causes a reversible phase change between a crystalline state and an amorphous state of the phase change material by using Joule heat generated by applying a specific current or voltage to the phase change material. The crystalline state is called a set state in terms of circuit. In the set state, the phase change material has an electrical characteristic like a metal with a low resistance. The amorphous state is called a reset state in terms of circuit. In the reset state, the phase change material has a resistance higher than in the set state. That is, PCRAM stores data on the basis of a resistance change between the crystalline state and the amorphous state, and determines the stored data by detecting a current flowing through the phase change material or a voltage change depending on a current change. In general, the set state is defined as having a logic level "0" and the reset state is defined as having a logic level "1". The phase change material maintains its state even when power is interrupted.

Meanwhile, a programming current can make the phase change material change from the crystalline state to the amorphous state, and vice versa. A set current is defined as a programming current that changes the phase change material of the memory cell to the set state, and a reset current is defined as a programming current that changes the phase change material of the memory cell to the reset state. The set current and the reset current are also called a set programming current and a reset programming current, respectively.

If the reset current is supplied to heat the phase change material for a certain time at a temperature higher than a melting temperature, the phase change material cools rapidly and changes to the amorphous state. Also, if the set current is supplied to heat the phase change material for a certain time at a temperature higher than a crystallization temperature and lower than a melting temperature, the phase change material cools slowly and changes to the crystalline state. Meanwhile, since a resistance value is differentiated according to the crystalline volume or the amorphous volume of the phase change material, a multi-level memory cell can be implemented. In general, the reset current is made to flow with a large current for a relatively shorter time than the set current, and the set current is made to flow with a small current for a relatively longer time than the reset current. That is, the state of the phase change material is changed by Joule heating generated under a specific condition by the supply of the programming current.

FIG. 1 is a circuit diagram of a conventional phase change memory device.

Referring to FIG. 1, a phase change memory device includes a phase change memory cell 110, a data sense amplifier 120, and a switch 130. That is, FIG. 1 illustrates the structure of the phase change memory device that performs a data read operation to detect data of the phase change memory cell 110.

The phase change memory cell 110 includes a cell diode D1 and a phase change element GST. The cell diode D1 has a cathode connected to a word line WL, and an anode connected to a first node N0. The phase change element GST is connected between a bit line BL and the first node N0.

The data sense amplifier 120 supplies a data detection current to the phase change memory cell 110 and detects a data detection voltage having a voltage level corresponding to a resistance of the phase change memory cell 110. The data sense amplifier 120 includes a data detection current supplying unit MP0 and a voltage comparing unit 121. The data detection current supplying unit MP0 supplies the data detection current, and the voltage comparing unit 121 compares the data detection voltage with a reference voltage VREF.

The switch is implemented with a PMOS transistor MP1 and selectively transfers the data detection current outputted from the data sense amplifier 120 to the phase change memory cell 110.

An operation of detecting data programmed into the phase change memory cell 110 will be described below.

When a word line WL, a read signal RD, and a selection signal SEL are all activated to low level in a data read mode, the data detection current outputted from the data detection current supplying unit MP0 is supplied to the phase change memory cell 110 through a PMOS transistor MP1. The cell diode D1 of the phase change memory cell 110 is forward-biased, the cell diode D1 is turned on from the moment when a voltage difference between the anode and the cathode of the cell diode D1 is larger than a threshold voltage (Vth). In this case, when the phase change element GST of the phase change memory cell 110 is in the amorphous state, it has a high resistance and thus a voltage level of a second node N1 rises. On the contrary, when the phase change element GST of the phase change memory cell 110 is in the crystalline state, it has a lower resistance than in the amorphous state and thus the voltage level of the second node N1 falls. Accordingly, the voltage comparing unit 121 of the data sense amplifier 120 detects the data stored in the phase change memory cell 110 by comparing the reference voltage VREF with the voltage of the second node N1.

Meanwhile, the phase change memory device of FIG. 1 has superior data detection performance when the phase change element GST of the phase change memory cell 110 is in the amorphous state (data "1"). However, the data detection performance of the phase change memory device is relatively degraded when the phase change element GST is in the crystalline state (data "0"). That is, since the switch 130 is implemented with the PMOS transistor MP1, a voltage difference ($V_{GS}$) between a gate and a source of the PMOS transistor MP1 becomes smaller as the voltage level of the second node N1 is lower. Thus, if the voltage difference ($V_{GS}$) between the gate and the source of the PMOS transistor MP1 is lower than the threshold voltage (Vth), a resistance of the PMOS transistor MP1 increases and consequently the PMOS transistor MP1 is turned off. Therefore, if the voltage level of the second node N1 becomes lower than a certain value, the data detection voltage corresponding to the resistance of the phase change element GST is not transferred to the second node N1. In such a case, even though the resistance of the phase change memory cell 110 is low, the voltage of the second node N1 does not reflect it. That is, performance in the detection of data "0" is degraded.

SUMMARY OF THE INVENTION

An embodiment of the present invention is directed to providing a nonvolatile memory device having improved data detection performance in a read operation.

Another embodiment of the present invention is directed to providing a nonvolatile memory device having a reduced layout area in terms of an entire circuit.

In accordance with an aspect of the present invention, there is provided a nonvolatile memory device comprising a data sense amplifier configured to supply a data detection current to a memory cell and detect a data detection voltage having a voltage level corresponding to a resistance of the memory cell, a first switching element configured to selectively transfer the data detection current to the memory cell and a second switching element configured to be turned on simultaneously with the first switching element to selectively transfer the data detection current to the memory cell, wherein the first switching element and the second switching element have a complementary voltage transfer characteristic. In accordance with another aspect of the present invention, there is provided a nonvolatile memory device comprising a data sense amplifier configured to supply a data detection current to a memory cell and detect a data detection voltage having a voltage level corresponding to a resistance of the memory cell, a PMOS transistor configured to selectively transfer the data detection current to the memory cell and an NMOS transistor configured to be turned on simultaneously with the PMOS transistor to selectively transfer the data detection current to the memory cell.

In accordance with another aspect of the present invention, there is provided a nonvolatile memory device, which supplies a data detection current to a memory cell and detects a data detection voltage having a voltage level corresponding to a resistance of the memory cell, the nonvolatile memory device comprising a first switch group comprising a plurality of switch pairs each comprising a first switching element and a second switching element, which have a complementary voltage transfer characteristic, the first switch group being configured to selectively transfer the data detection current to a plurality of memory cells of a first cell block and a second switch group comprising a plurality of switch pairs each comprising a first switching element and a second switching element, which have a complementary voltage transfer characteristic, the second switch group being configured to selectively transfer the data detection current to a plurality of memory cells of a second cell block, wherein the same type of the switching elements (the first switching element or the second switching element) are disposed in the first cell block and the second cell block of the first and second switch groups.

In accordance with another aspect of the present invention, there is provided a nonvolatile memory device, which supplies a data detection current to a memory cell and detects a data detection voltage having a voltage level corresponding to a resistance of the memory cell, the nonvolatile memory device comprising a first switch group comprising a plurality of switch pairs each comprising a PMOS transistor and an NMOS transistor and configured to selectively transfer the data detection current to a plurality of memory cells of a first cell block and a second switch group comprising a plurality of switch pairs each comprising a PMOS transistor and an NMOS transistor and configured to selectively transfer the data detection current to a plurality of memory cells of a second cell block, wherein the same type of the transistors (PMOS transistor or NMOS transistor) are disposed in the first cell block and the second cell block of the first and second switch groups.

BRIEF DESCRIPTION OF THE DRAWINGS

Features of the present invention will become apparent to those skilled in the art from the following description with reference to the figures, in which.

DESCRIPTION OF SPECIFIC EMBODIMENTS

Figure 1:
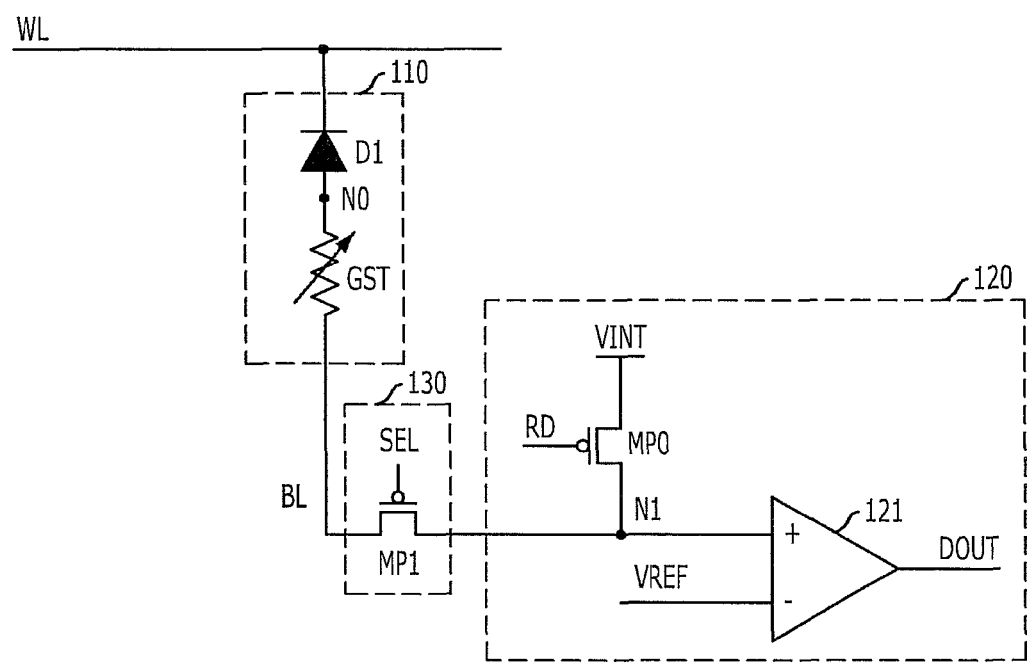
FIG. 1 is a circuit diagram of a conventional phase change memory device.

Other objects and advantages of the present invention can be understood by the following description, and become apparent with reference to the embodiments of the present invention. In the drawings and detailed description, since the terms, numerals, and symbols used to indicate devices or blocks may be expressed by sub-units, it should be noted that the same terms, numerals, and symbols may not indicate the same devices in a whole circuit.

Generally, logic signals of a circuit have a high level (H) and a low level (L) according to a voltage level and may be represented by "1" and "0." It will be assumed that, if necessary, the logic signals may have a high impedance (Hi-Z) state. Furthermore, the terms p-channel metal oxide semiconductor (PMOS) and n-channel metal oxide semiconductor (NMOS) used herein are a type of metal oxide semiconductor field effect transistor (MOSFET).

Figure 2:
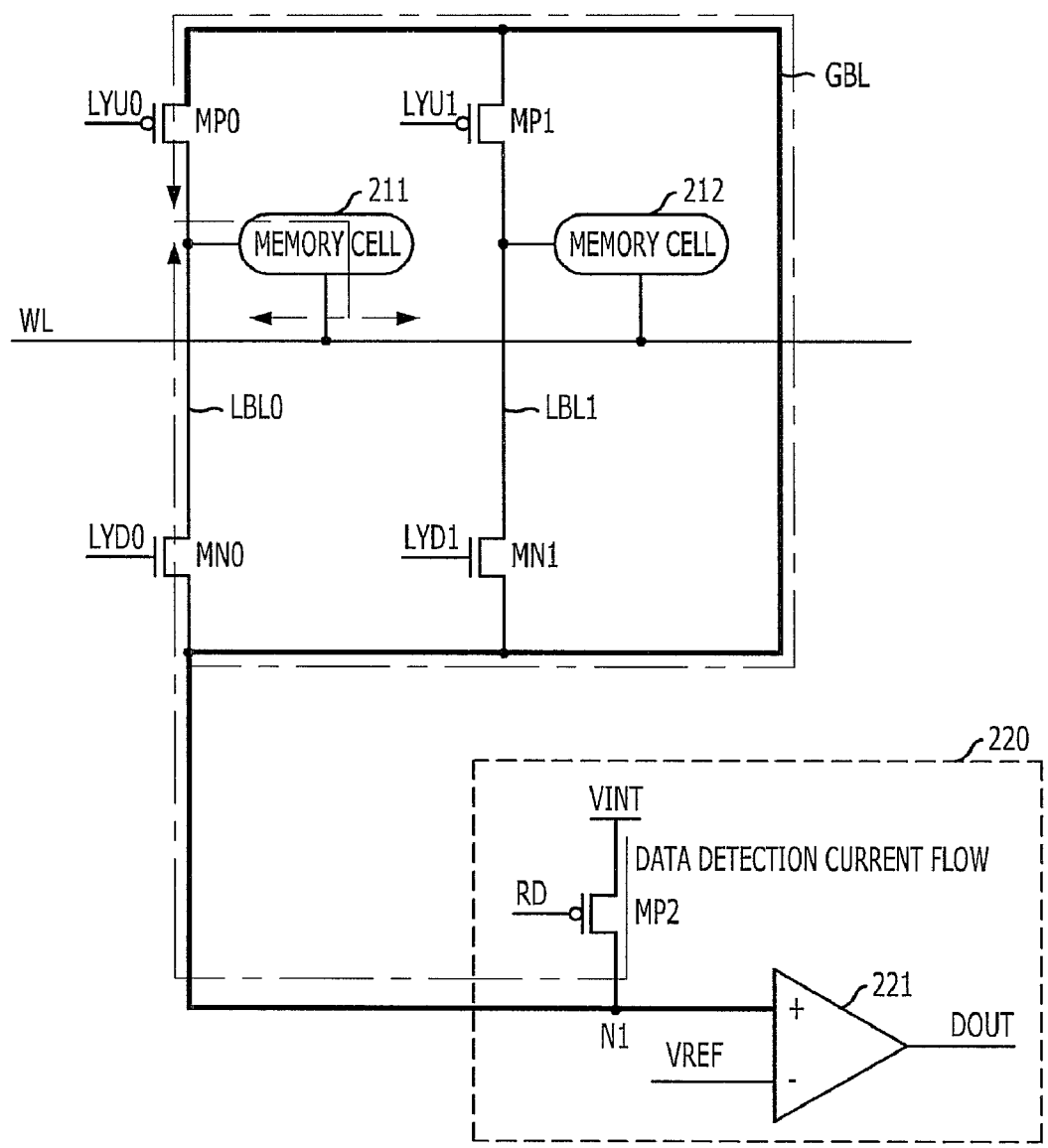
FIG. 2 is a circuit diagram of a nonvolatile memory device in accordance with a first embodiment of the present invention.

FIG. 2 is a circuit diagram of a nonvolatile memory device in accordance with a first embodiment of the present invention.

Referring to FIG. 2, the nonvolatile memory device includes a data sense amplifier 220, a first PMOS transistor MP0, a first NMOS transistor MN0, a second PMOS transistor MP1, and a second NMOS transistor MN1. The data sense amplifier 220 supplies a data detection current to first and second memory cells 211 and 212 and detects a data detection voltage having a voltage level corresponding to resistances of the first and second memory cells 211 and 212. The first PMOS transistor MP0 selectively transfers the data detection current to the first memory cell 211. The first NMOS transistor MN0 is turned on simultaneously with the first PMOS transistor MP0 to selectively transfer the data detection current to the first memory cell 211. The second PMOS transistor MP1 selectively transfers the data detection current to the second memory cell 212. The second NMOS transistor MN1 is turned on simultaneously with the second PMOS transistor MP1 to selectively transfer the data detection current to the second memory cell 212.

In the first embodiment of the present invention, the first memory cell 211 and the second memory cell 212 are devices such as phase change memory cells which store data by using a resistance change or a differentiated resistance. Moreover, limited numbers of word lines WL, memory cells, global bit lines GBL, and local bit lines LBL are illustrated for clear explanation.

The detailed structure and operation of the nonvolatile memory device in accordance with the first embodiment of the present invention will be described below.

The data sense amplifier 220 includes a data detection current supplying unit MP2 and a voltage comparing unit 221. The data detection current supplying unit MP2 supplies the data detection current, and the voltage comparing unit 221 compares the data detection voltage with a reference voltage VREF.

The data sense amplifier 220 transfers the data detection current through a global bit line GBL. To be specific, when the first switch pair MP0 and MN0 connected between the global bit line GBL and a first local bit line LBL0 is turned on, the data sense amplifier 220 supplies the data detection current to the first memory cell 211 connected to the first local bit line LBL0. Also, when the second switch pair MP1 and MN1 connected between the global bit line GBL and a second local bit line LBL1 is turned on, the data sense amplifier 220 supplies the data detection current to the second memory cell 212 connected to the second local bit line LBL1.

The first switch pair MP0 and MN0 implemented with the first PMOS transistor MP0 and the first NMOS transistor MN0, and the second switch pair MP1 and MN1 implemented with the second PMOS transistor MP1 and the second NMOS transistor MN1 are a type of local bit line selection switches. Therefore, the data detection current is selectively supplied to the first memory cell 211 or the second memory cell 212 according to activation of first selection signals LYU0 and LYD0 and second selection signals LYU1 and LYD1. The first selection signals LYU0 and LYD0 are signals for controlling the first switch pair MP0 and MN0, and the second selection signals LYU1 and LYD1 are signals for controlling the second switch pair MP1 and MN1.

Figure 3:
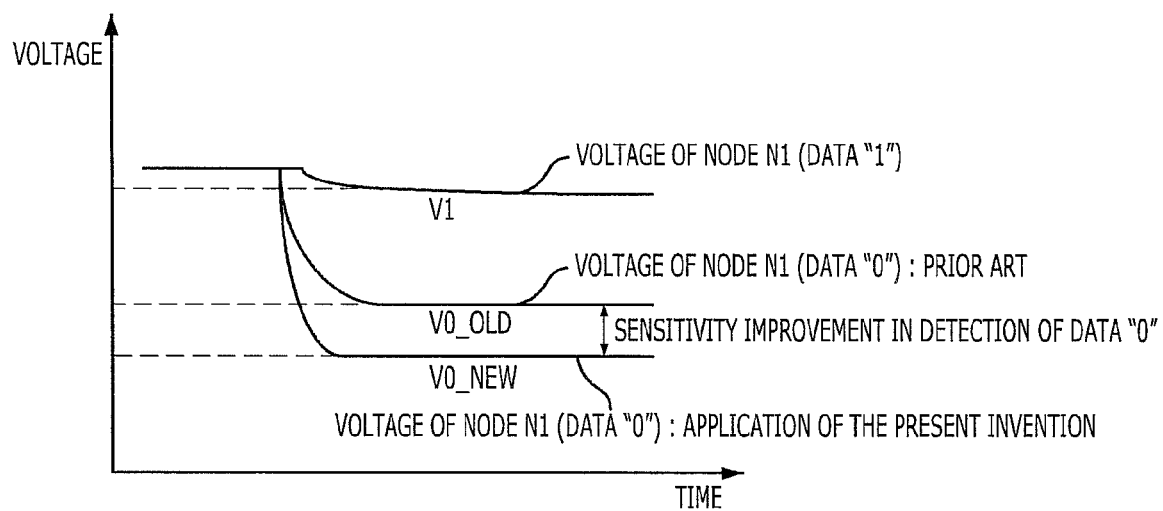
FIG. 3 is a graph explaining an internal operation of the nonvolatile memory device in accordance with the first embodiment of the present invention.

FIG. 3 is a graph explaining an internal operation of the nonvolatile memory device in accordance with the first embodiment of the present invention.

The operation of detecting data programmed into the first memory cell 211 will be described below in detail with reference to FIGS. 2 and 3.

When a word line WL, a read signal RD, and first selection signals LYU0 and LYD0 are all activated in a data read mode, the data detection current outputted from the data detection current supplying unit MP2 is simultaneously supplied to the first memory cell 211 through the first switch pair MP0 and MN0, that is, the first PMOS transistor MP0 and the first NMOS transistor MN0.

A case where the first memory cell 211 has a high resistance is defined as data "1" being stored, and a case where the first memory cell 211 has a lower resistance than that when it stores data "1" is defined as data "0" being stored.

First, if the data "1" is stored in the first memory cell 211, the data detection current is supplied to the first memory cell 211 through the first switch pair MP0 and MN0 and thus a first node N1 is kept at a high voltage V1. At this point, it can be conceptually explained that the data detection voltage corresponding to the resistance of the first memory cell 211 is transferred to the first node N1 through the first PMOS transistor MP0 of the first switch pair MP0 and MN0, without threshold voltage loss of the transistor.

Furthermore, if the data "0" is stored in the first memory cell 211, the data detection current is supplied to the first memory cell 211 through the first switch pair MP0 and MN0 and thus the first node N1 is kept at a low voltage V0_NEW. At this point, it can be conceptually explained that the data detection voltage corresponding to the resistance of the first memory cell 211 is transferred to the first node N1 through the first NMOS transistor MN0 of the first switch pair MP0 and MN0, without threshold voltage loss of the transistor.

Therefore, the voltage comparing unit 221 of the data sense amplifier 220 detects the data stored in the first memory cell 211 by comparing the reference voltage VREF with the voltage of the first node N1.

In the current embodiment, the data detection current is simultaneously transferred to the first memory cell 211 through the first PMOS transistor MP0 and the first NMOS transistor MN0, and the data detection voltage having the voltage level corresponding to the resistance of the first memory cell 211 is again transferred to the first node N1 through the first PMOS transistor MP0 and the first NMOS transistor MN0. In this case, since the first PMOS transistor MP0 and the first NMOS transistor MN0 are simultaneously used, the voltage level of the first node N1 is determined without threshold voltage loss of the transistor. Hence, the nonvolatile memory device in accordance with the first embodiment of the present invention has superior performance in the detection of data "1" and data "0".

In summary, the data detection current is transferred to the memory cell by simultaneously turning on the PMOS transistor suitable for transferring a relatively high voltage and the NMOS transistor suitable for transferring a relatively low voltage. Thus, when the data detection voltage corresponding to the resistance of the memory cell is at a high voltage level, it is transferred through the PMOS transistor, without threshold voltage loss. On the other hand, when the data detection voltage corresponding to the resistance of the memory cell is at a low voltage level, it is transferred through the NMOS transistor, without threshold voltage loss. Consequently, it is possible to improve the detection performance in detecting the data of the memory cell by using the transferred data detection voltage.

Figure 4:
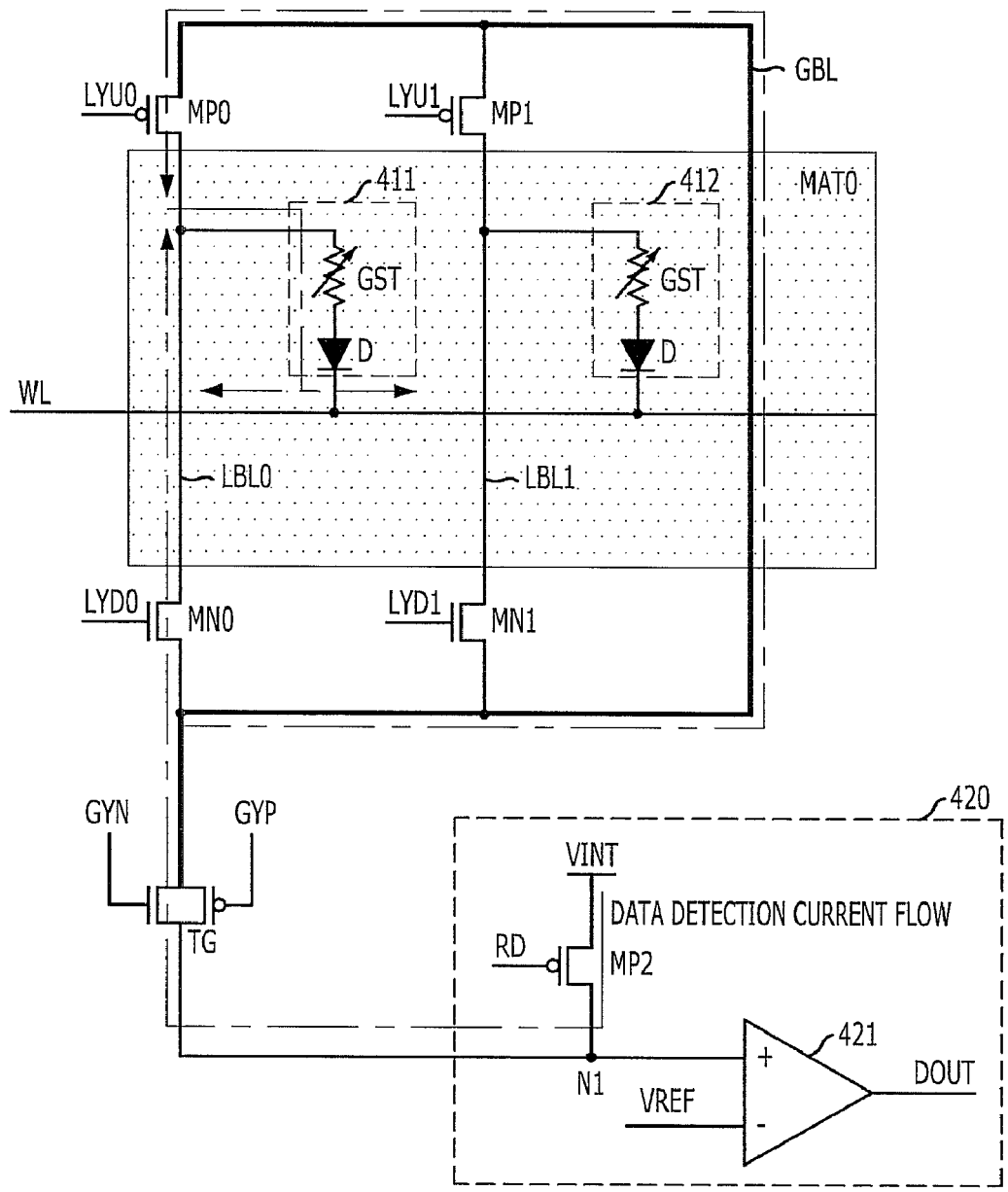
FIG. 4 is a circuit diagram of a nonvolatile memory device in accordance with a second embodiment of the present invention.

FIG. 4 is a circuit diagram of a nonvolatile memory device in accordance with a second embodiment of the present invention.

Referring to FIG. 4, the nonvolatile memory device includes a data sense amplifier 420, a first PMOS transistor MP0, a first NMOS transistor MN0, a second PMOS transistor MP1, and a second NMOS transistor MN1. The data sense amplifier 420 supplies a data detection current to a first change memory cell 411 and a second phase change memory cell 412, and detects a data detection voltage having a voltage level corresponding to resistances of the first phase change memory cell 411 and the second phase change memory cell 412. The first PMOS transistor MP0 selectively transfers the data detection current to the first phase change memory cell 411. The first NMOS transistor MN0 is turned on simultaneously with the first PMOS transistor MP0 to selectively transfer the data detection current to the first phase change memory cell 411. The second PMOS transistor MP1 selectively transfers the data detection current to the second phase change memory cell 412. The second NMOS transistor MN1 is turned on simultaneously with the second PMOS transistor MP1 to selectively transfer the data detection current to the second phase change memory cell 412.

In the second embodiment of the present invention, limited numbers of word lines WL, phase change memory cells, global bit lines GBL, and local bit lines LBL are illustrated for clear explanation.

The detailed structure and operation of the nonvolatile memory device in accordance with the second embodiment of the present invention will be described below.

The data sense amplifier 420 includes a data detection current supplying unit MP2 and a voltage comparing unit 421. The data detection current supplying unit MP2 supplies the data detection current, and the voltage comparing unit 421 compares the data detection voltage with a reference voltage VREF.

The data sense amplifier 420 transfers the data detection current through a global bit line GBL when a transmission gate TG is turned on. To be specific, when the first switch pair MP0 and MN0 connected between the global bit line GBL and a first local bit line LBL0 is turned on, the data sense amplifier 420 supplies the data detection current to the first phase change memory cell 411 connected to the first local bit line LBL0. Also, when the second switch pair MP1 and MN1 connected between the global bit line GBL and a second local bit line LBL1 is turned on, the data sense amplifier 420 supplies the data detection current to the second phase change memory cell 412 connected to the second local bit line LBL1.

The first switch pair MP0 and MN0 implemented with the first PMOS transistor MP0 and the first NMOS transistor MN0, and the second switch pair MP1 and MN1 implemented with the second PMOS transistor MP1 and the second NMOS transistor MN1 are a type of local bit line selection switches. The transmission gate TG is a type of a global bit line selection switch. Therefore, the data detection current is selectively supplied to the first phase change memory cell 411 or the second phase change memory cell 412 according to activation of first local bit line selection signals LYU0 and LYD0 and second local bit line selection signals LYU1 and LYD1. The first local bit line selection signals LYU0 and LYD0 are signals for controlling the first switch pair MP0 and MN0, and the second local bit line selection signals LYU1 and LYD1 are signals for controlling the second switch pair MP1 and MN1.

Figure 5:
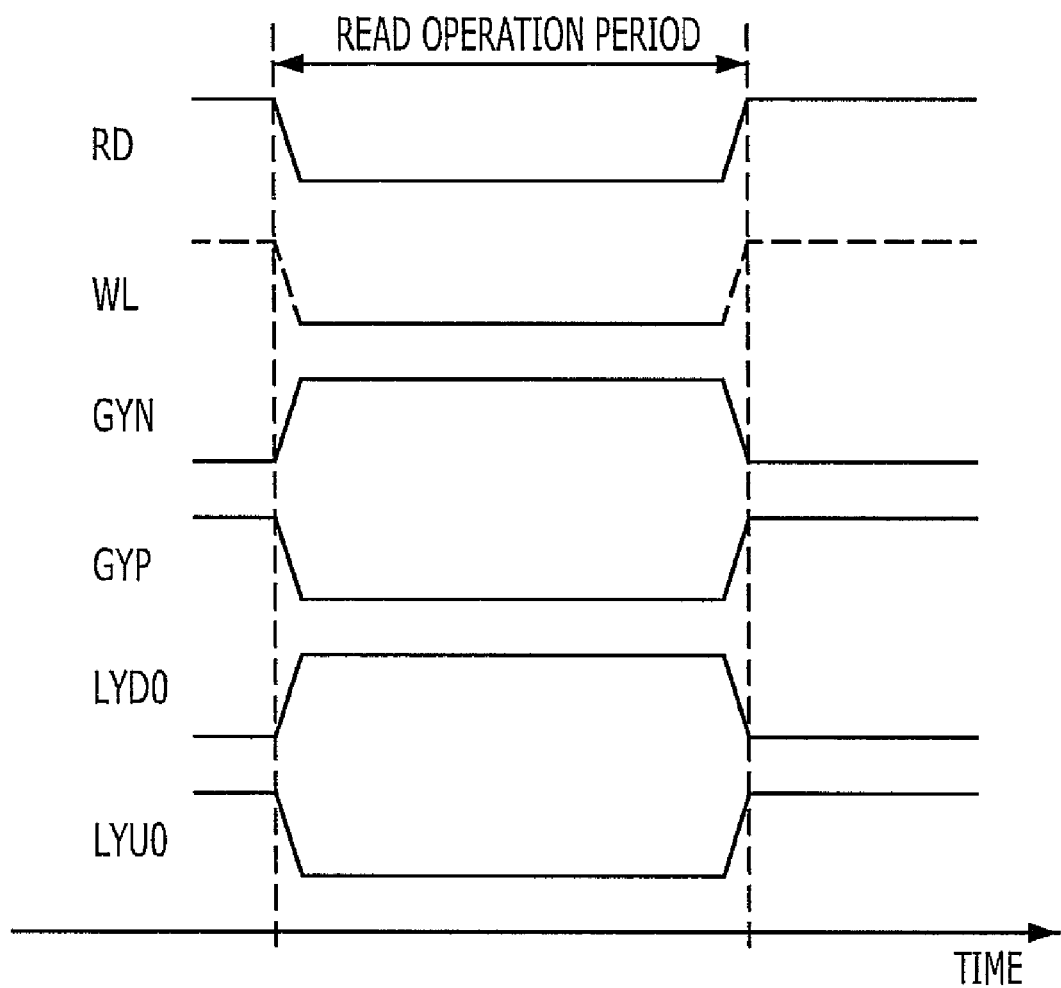
FIG. 5 is a timing diagram explaining an internal operation of the nonvolatile memory device in accordance with the second embodiment of the present invention.

FIG. 5 is a timing diagram explaining an internal operation of the nonvolatile memory device in accordance with the second embodiment of the present invention.

The operation of detecting data programmed into the first phase change memory cell 411 will be described below in detail with reference to FIGS. 4 and 5. The phase change memory cell is implemented with a cell diode D and a phase change element GST. The resistance of the phase change memory cell in the data read operation substantially represents a resistance of the phase change element GST.

When the word line WL, a read signal RD, and first local bit line selection signals LYU0 and LYD0 are all activated in a data read mode, the data detection current outputted from the data detection current supplying unit MP2 is simultaneously supplied to the first phase change memory cell 411 through the first switch pair MP0 and MN0, that is, the first PMOS transistor MP0 and the first NMOS transistor MN0.

A case where the first phase change memory cell 411 has a high resistance (an amorphous state) is defined as data "1" being stored, and a case where the first phase change memory cell 411 has a lower resistance (a crystalline state) than that when it stores data "1" is defined as data "0" being stored.

First, if the data "1" is stored in the first phase change memory cell 411, the data detection current is supplied to the first phase change memory cell 411 through the first switch pair MP0 and MN0 and thus a first node N1 is kept at a high voltage. At this point, it can be conceptually explained that the data detection voltage corresponding to the resistance of the first phase change memory cell 411 is transferred to the first node N1 through the first PMOS transistor MP0 of the first switch pair MP0 and MN0, without threshold voltage loss of the transistor.

Furthermore, if the data "0" is stored in the first phase change memory cell 411, the data detection current is supplied to the first phase change memory cell 411 through the first switch pair MP0 and MN0 and thus the first node N1 is kept at a low voltage. At this point, it can be explained that the data detection voltage corresponding to the resistance of the first phase change memory cell 411 is transferred to the first node N1 through the first NMOS transistor MN0 of the first switch pair MP0 and MN0, without threshold voltage loss of the transistor.

Therefore, the voltage comparing unit 421 of the data sense amplifier 420 detects the data stored in the first phase change memory cell 411 by comparing the reference voltage VREF with the voltage of the first node N1.

In the current embodiment, the data detection current is simultaneously transferred to the first phase change memory cell 411 through the first PMOS transistor MP0 and the first NMOS transistor MN0, and the data detection voltage having the voltage level corresponding to the resistance of the first phase change memory cell 411 is again transferred to the first node N1 through the first PMOS transistor MP0 and the first NMOS transistor MN0. In this case, since the PMOS transistor and the NMOS transistor are simultaneously used, the voltage level of the first node N1 is determined without threshold voltage loss of the transistor. Hence, the nonvolatile memory device in accordance with the second embodiment of the present invention has superior performance in the detection of data "1" and data "0".

Figure 6:
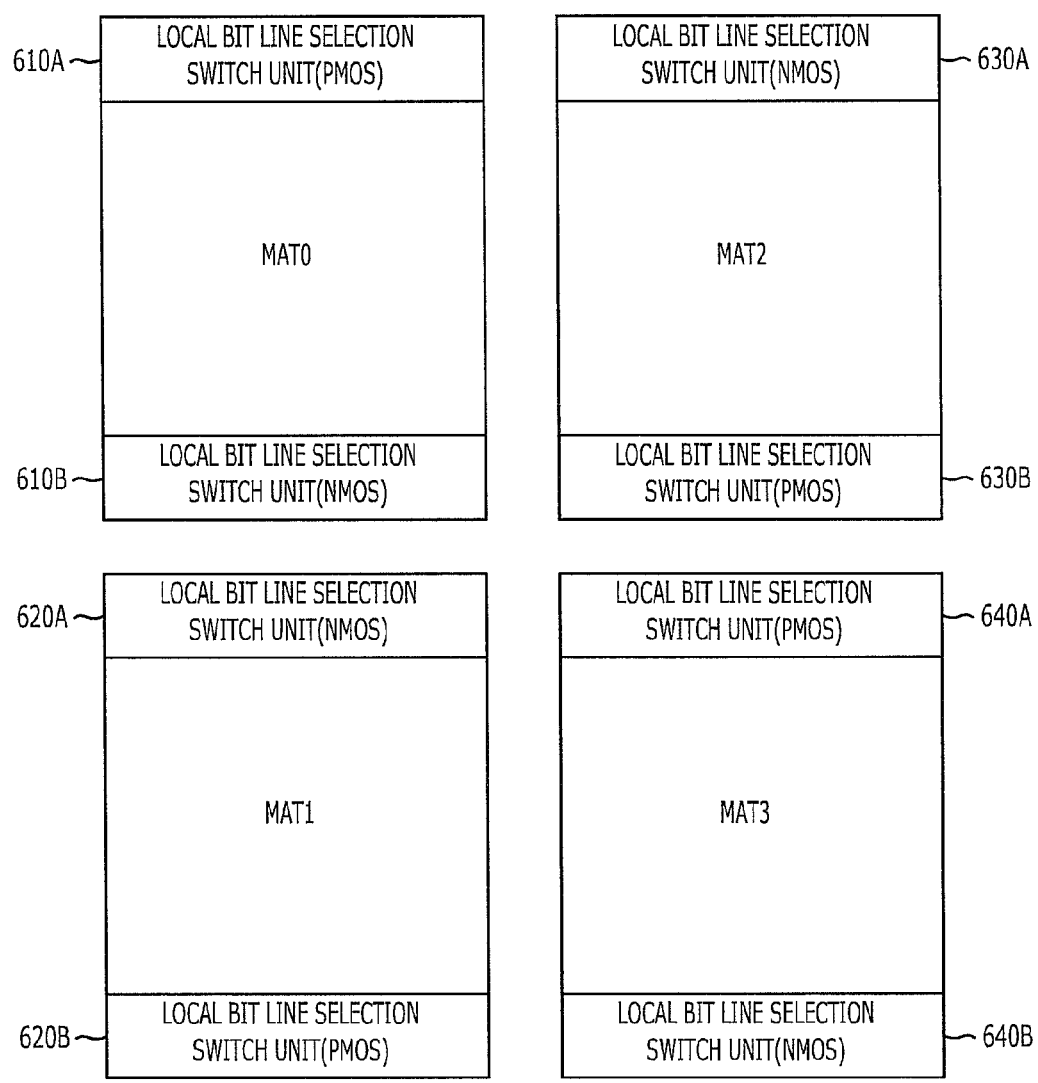
FIG. 6 is a layout diagram of the phase change memory device in accordance with the second embodiment of the present invention.

FIG. 6 is a layout diagram of the phase change memory device in accordance with the second embodiment of the present invention.

An internal memory area of the phase change memory device is divided into a plurality of banks, and each bank is sub-divided into a plurality of cell blocks. The cell block is also called a unit cell matrix, a sub cell array, or a mat.

First, a layout of a first cell block MAT0 and a second cell block MAT1 will be described below in detail.

Referring to FIG. 6, the phase change memory device detecting the data detection voltage having the voltage level corresponding to the resistance of the phase change memory cell by supplying the data detection current to the phase change memory cell includes first switch groups 610A and 610B and second switch groups 620A and 620B. The first switch groups 610A and 610B include a plurality of switch pairs each having a PMOS transistor and an NMOS transistor, and selectively transfer the data detection current to the memory cells of the first cell block MAT0. The second switch groups 620A and 620B include a plurality of switch pairs each having a PMOS transistor and an NMOS transistor, and selectively transfer the data detection current to the memory cells of the second cell block MAT1. Moreover, the same types of transistors (NMOS transistors) are disposed in the first cell block MAT0 of the first switch groups 610A and 610B and in the second cell block MAT1 of the second switch groups 620A and 620B.

The first switch groups 610A and 610B are disposed on either side of the first cell block MAT0, respectively. The plurality of PMOS transistors 610A are disposed on a first side of the first cell block MAT0, and the plurality of NMOS transistors 610B are disposed on a second side of the first cell block MAT0.

Furthermore, the second switch groups 620A and 620B are disposed on either side of the second cell block MAT1, respectively. The plurality of NMOS transistors 620A are disposed on a first side of the second cell block MAT1, and the plurality of PMOS transistors 620B are disposed on a second side of the second cell block MAT1. The PMOS and NMOS transistors of the first switch groups 610A and 610B, and the NMOS and PMOS transistors of the second switch groups 620A and 620B are local bit line selection switches.

Next, a layout of a third cell block MAT2 and a fourth cell block MAT3 will be described below in detail.

Referring again to FIG. 6, the phase change memory device detecting the data detection voltage having the voltage level corresponding to the resistance of the phase change memory cell by supplying the data detection current to the phase change memory cell includes third switch groups 630A and 630B and fourth switch groups 640A and 640B. The third switch groups 630A and 630B include a plurality of switch pairs each having a PMOS transistor and an NMOS transistor, and selectively transfer the data detection current to the memory cells of the third cell block MAT2. The fourth switch groups 640A and 640B include a plurality of switch pairs each having a PMOS transistor and an NMOS transistor, and selectively transfer the data detection current to the memory cells of the fourth cell block MAT3. Moreover, the same types of transistors (PMOS transistors) are disposed in the third cell block MAT2 of the third switch groups 630A and 630B and in the fourth cell block MAT3 of the fourth switch groups 640A and 640B.

The third switch groups 630A and 630B are disposed on either side of the third cell block MAT2, respectively. The plurality of NMOS transistors 630A are disposed on a first side of the third cell block MAT2, and the plurality of PMOS transistors 630B are disposed on a second side of the third cell block MAT2.

Furthermore, the fourth switch groups 640A and 640B are disposed on either side of the fourth cell block MAT3, respectively. The plurality of PMOS transistors 640A are disposed on a first side of the fourth cell block MAT3, and the plurality of NMOS transistors 640B are disposed on a second side of the fourth cell block MAT3. The PMOS and NMOS transistors of the third switch groups 630A and 630B, and the NMOS and PMOS transistors of the fourth switch groups 640A and 640B are local bit line selection switches.

As mentioned above, in arranging the switch pairs each having the PMOS transistor and the NMOS transistor, the same type of transistors, PMOS transistors or NMOS transistors, are arranged between the adjacent cell blocks, thereby minimizing the layout area. That is, the layout area can be reduced by minimizing the separation of the active areas of the device. In the overall layout of the phase change memory device illustrated in FIG. 6, the arrangement relationship of the first cell block MAT0 and the second cell block MAT1 and the arrangement relationship of the third cell block MAT2 and the fourth cell block MAT3 are merely exemplary for the purpose of clearly explaining that the same types of MOS transistors are arranged between the adjacent cell blocks. It is apparent that a larger number of cell blocks may be applied in the phase change memory device by expanding the above-described technical principle. Moreover, although the overall layout of the phase change memory device, one of nonvolatile memory devices, has been described as one exemplary embodiment, the present invention can also be applied to a variety of nonvolatile memory devices.

In the first and second embodiments described above, the PMOS transistors and the NMOS transistors act as switching elements and have a complementary voltage transfer characteristic. That is, the PMOS transistors have a smaller high voltage transfer loss than the NMOS transistors, and the NMOS transistors has a smaller low voltage transfer loss than the PMOS transistors. Therefore, the voltage loss of a threshold voltage or the like can be minimized by designing the circuit to apply the power supply voltage (VDD) to sources of the PMOS transistors and apply the ground voltage (VSS) to sources of the NMOS transistors. Moreover, the present invention can be applied to a variety of switching elements having a complementary voltage transfer characteristic, like PMOS transistors and NMOS transistors.

In accordance with the embodiments of the present invention, the data detection performance can be improved by reinforcing the transfer characteristic of the data detection voltage used for detecting the data stored in the memory cells. Furthermore, the increase of the layout area due to different types of the switching elements or transistors added can be minimized. Thus, it is further advantageous in terms of costs by increasing the net die, that is, the number of semiconductor memory devices that can be fabricated with a single wafer.

While the present invention has been described with respect to the specific embodiments, it will be apparent to those skilled in the art that various changes and modifications may be made without departing from the spirit and scope of the invention as defined in the following claims.

For example, although not directly related to the technical spirit of the present invention, embodiments including additional structures may be exemplified for further detailed description. Furthermore, the active high or active low structure representing the activation states of signals or circuits may be changed according to embodiments. Moreover, the configurations of the transistors may also be changed in order to implement the same functions. That is, the PMOS transistor and the NMOS transistor may be exchanged with each other and, if necessary, a variety of transistors may be used herein. Numerous modifications can be made in the circuit configuration and can be easily deduced by those skilled in the art. Therefore, their enumeration will be omitted herein.

What is claimed is:

1. A nonvolatile memory device, comprising:
   a data sense amplifier configured to supply a data detection current to a memory cell and detect a data detection voltage having a voltage level corresponding to a resistance of the memory cell;
   a first switching element configured to selectively transfer the data detection current to the memory cell; and
   a second switching element configured to be turned on simultaneously with the first switching element to selectively transfer the data detection current to the memory cell,
   wherein the first switching element and the second switching element have a complementary voltage transfer characteristic.

2. The nonvolatile memory device of claim 1, wherein a high voltage transfer loss of the first switching element is smaller than a high voltage transfer loss of the second switching element and a low voltage transfer loss of the second switching element is smaller than a low voltage transfer loss of the first switching element.

3. A nonvolatile memory device, comprising:
- a data sense amplifier configured to supply a data detection current to a memory cell and detect a data detection voltage having a voltage level corresponding to a resistance of the memory cell;
- a PMOS transistor configured to selectively transfer the data detection current to the memory cell; and
- a NMOS transistor configured to be turned on simultaneously with the PMOS transistor to selectively transfer the data detection current to the memory cell.

4. The nonvolatile memory device of claim 3, wherein the memory cell comprises a phase change memory cell.

5. The nonvolatile memory device of claim 3, wherein the data sense amplifier comprises:
- a data detection current supplying unit configured to supply the data detection current; and
- a voltage comparing unit configured to compare the data detection voltage with a reference voltage.

6. A nonvolatile memory device supplying a data detection current to a memory cell and detecting a data detection voltage having a voltage level corresponding to a resistance of the memory cell, the nonvolatile memory device comprising:
- a first switch group comprising a plurality of switch pairs and each of the plurality of switch pairs comprising a first switching element of the first switch group and a second switching element of the first switch group, wherein the first switching element of the first switch group and the second switching element of the first switch group have a complementary voltage transfer characteristic, and the first switch group is configured to selectively transfer the data detection current to a plurality of memory cells of a first cell block; and
- a second switch group comprising a plurality of switch pairs and each of the plurality of switch pairs comprising a first switching element of the second switch group and a second switching element of the second switch group, wherein the first switching element of the second switch group and the second switching element of the second switch group have a complementary voltage transfer characteristic, and the second switch group is configured to selectively transfer the data detection current to a plurality of memory cells of a second cell block,
- wherein the first switching element of the first switch group disposed in the first cell block and the first switching element of the second switch group disposed in the second cell block are the same type, and the second switching element of the first switch group disposed in the first cell block and the second switching element of the second switch group disposed in the second cell block are the same type.

7. The nonvolatile memory device of claim 6, wherein the first switching element of the first switch group and the second switching element of the first switch group are simultaneously turned on to transfer the data detection current to the plurality of memory cells of the first cell block.

8. The nonvolatile memory device of claim 6, wherein a high voltage transfer loss of the first switching element of the first switch group is smaller than a high voltage transfer loss of the second switching element of the first switch group, and a low voltage transfer loss of the second switching element of the first switch group is smaller than a low voltage transfer loss of the first switching element of the first switch group.

9. The nonvolatile memory device of claim 6, wherein a high voltage transfer loss of the first switching element of the second switch group is smaller than a high voltage transfer loss of the second switching element of the second switch group, and a low voltage transfer loss of the second switching element of the second switch group is smaller than a low voltage transfer loss of the first switching element of the second switch group.

10. A nonvolatile memory device supplying a data detection current to a memory cell and detecting a data detection voltage having a voltage level corresponding to a resistance of the memory cell, the nonvolatile memory device comprising:
- a first switch group comprising a plurality of switch pairs and each of the plurality of switch pairs comprising a PMOS transistor of the first switch group and an NMOS transistor of the first switch group, wherein, the first switch group is configured to selectively transfer the data detection current to a plurality of memory cells of a first cell block; and
- a second switch group comprising a plurality of switch pairs and each of the plurality of switch pairs comprising a PMOS transistor of the second switch group and an NMOS transistor of the second switch group wherein, the second switch group is configured to selectively transfer the data detection current to a plurality of memory cells of a second cell block,
- wherein the PMOS transistor of the first switch group disposed in the first cell block and the PMOS transistor of the second switch group disposed in the second cell block are the same type, and the NMOS transistor of the first switch group disposed in the first cell block and the NMOS transistor of the second switch group disposed in the second cell block are the same type.

11. The nonvolatile memory device of claim 10, wherein the memory cell comprises a phase change memory cell.

12. The nonvolatile memory device of claim 10, wherein the PMOS transistor of the first switch group and the NMOS transistor of the first switch group are simultaneously turned on to transfer the data detection current to the plurality of memory cells of the first cell block.

13. The nonvolatile memory device of claim 10, wherein the PMOS transistor of the second switch group and the NMOS transistor of the second switch group are simultaneously turned on to transfer the data detection current to the plurality of memory cells of the second cell block.

14. The nonvolatile memory device of claim 10, wherein the first switch group is disposed on a first side and a second side of the first cell block;
- the PMOS transistor is disposed on the first side of the first cell block; and
- the NMOS transistor is disposed on the second side of the first cell block.

15. The nonvolatile memory device of claim 14, wherein the second switch group is disposed on a first side and a second side of the second cell block;
- the NMOS transistor is disposed on the first side of the second cell block; and
- the PMOS transistor is disposed on the second side of the second cell block.

16. The nonvolatile memory device of claim 15, wherein the first side of the first cell block is adjacent to the second side of the second cell block.

17. The nonvolatile memory device of claim 15, wherein the second side of the first cell block is adjacent to the first side of the second cell block.

* * * * *